(12) United States Patent
Le et al.

(10) Patent No.: US 12,375,011 B2
(45) Date of Patent: Jul. 29, 2025

(54) CIRCUIT FOR CONTROLLING POWER TRANSISTORS OF AN INVERTER ARM

(71) Applicant: SAFRAN, Paris (FR)

(72) Inventors: Thanh Long Le, Moissy-cramayel (FR); Jean Sylvio Ngoua Teu Magambo, Moissy-cramayel (FR)

(73) Assignee: SAFRAN, Paris (FR)

( * ) Notice: Subject to any disclaimer, the term of this patent is extended or adjusted under 35 U.S.C. 154(b) by 0 days.

(21) Appl. No.: 18/260,058

(22) PCT Filed: Jan. 21, 2022

(86) PCT No.: PCT/FR2022/050122
§ 371 (c)(1),
(2) Date: Jun. 30, 2023

(87) PCT Pub. No.: WO2022/162296
PCT Pub. Date: Aug. 4, 2022

(65) Prior Publication Data
US 2024/0079971 A1    Mar. 7, 2024

(30) Foreign Application Priority Data
Jan. 28, 2021 (FR) ...................................... 2100811

(51) Int. Cl.
*H02M 7/539* (2006.01)
*B64D 41/00* (2006.01)
(Continued)

(52) U.S. Cl.
CPC ............ *H02M 7/539* (2013.01); *B64D 41/00* (2013.01); *H02M 1/088* (2013.01); *H03K 17/08122* (2013.01)

(58) Field of Classification Search
CPC ........ H02M 7/539; H02M 1/088; H02M 1/08; H02M 7/53871; B64D 41/00;
(Continued)

(56) References Cited

U.S. PATENT DOCUMENTS 6,841,971 B1 * 1/2005 Spee ...................... H02J 7/0016
320/119
10,218,258 B1 * 2/2019 Nagl ....................... H02M 1/08
(Continued)

OTHER PUBLICATIONS

International Search Report & Written Opinion mailed on May 3, 2022 in PCT/FR2022/050122 filed on Jan. 21, 2022 (14 pages).
(Continued)

*Primary Examiner* — Jared Fureman
*Assistant Examiner* — Michael J Warmflash
(74) *Attorney, Agent, or Firm* — Oblon, McClelland, Maier & Neustadt, L.L.P.

(57) ABSTRACT

A control circuit for a first switch includes at least one transistor, the first switch being arranged in series with a second switch in an inverter arm of an electrical power supply device supplying a load connected to the mid-point of the series arrangement of the first and second switch. The control circuit is configured to adjust the gate-source voltage of the at least one transistor of the first switch according to a control scheme including, during a deactivation period of the first switch, the increase of the gate-source voltage in a time window including the deactivation of the second switch and the reduction of the gate-source voltage in a time window including the activation of the second switch.

13 Claims, 5 Drawing Sheets

(51) Int. Cl.
*H02M 1/088* (2006.01)
*H03K 17/0812* (2006.01)

(58) Field of Classification Search
CPC ........... H03K 17/08122; H03K 17/063; H03K 17/163; Y02B 70/10
See application file for complete search history.

(56) References Cited

U.S. PATENT DOCUMENTS

| | | | |
|---|---|---|---|
| 11,632,072 B2 * | 4/2023 | Bourse | H02P 27/085 |
| | | | 318/400.17 |
| 2006/0087300 A1 * | 4/2006 | Endo | G05F 1/618 |
| | | | 323/282 |
| 2010/0308751 A1 * | 12/2010 | Nerone | H02M 1/32 |
| | | | 315/312 |
| 2011/0057724 A1 * | 3/2011 | Pabon | H02M 7/219 |
| | | | 307/31 |
| 2014/0167720 A1 * | 6/2014 | Chiang | H02M 3/158 |
| | | | 323/282 |
| 2016/0056706 A1 * | 2/2016 | Inomata | H02M 5/297 |
| | | | 323/271 |
| 2016/0204752 A1 * | 7/2016 | Li | H03F 3/30 |
| | | | 330/262 |
| 2019/0319531 A1 * | 10/2019 | März | H02M 1/38 |
| 2020/0321959 A1 * | 10/2020 | Bhat | H02M 1/08 |
| 2021/0104866 A1 * | 4/2021 | Avci | H01S 5/06825 |

OTHER PUBLICATIONS

Preliminary French Search Report dated Oct. 7, 2021 in French Application 2100811 filed on Jan. 28, 2021 (9 pages, with Translation of Categories).

* cited by examiner

CIRCUIT FOR CONTROLLING POWER TRANSISTORS OF AN INVERTER ARM

TECHNICAL FIELD

The field of the invention is that of power supply devices for electrical loads, for example equipment on board an aircraft. The invention relates more particularly to a control circuit for a switch of an inverter arm.

PRIOR ART

An inverter arm of a device for supplying an electrical load typically consists of a series arrangement of a first switch and a second switch the mid-point of which is connected to the load. The first and second switch thus form a switch on the upper side of the arm and a switch on the lower side of the arm. Each switch may comprise at least one power semiconductor component, for example a wide-gap transistor of the SiC or GaN type which has a gate threshold voltage lower than that of the silicon-based components.

As reported in the article by J. -S. N. TEU and T. -L. LE, "Reduction of the Crosstalk Conduction Effect of parallel GaN HEMTs in Half-Bridge," 2020 IEEE Energy Conversion Congress and Exposition (ECCE), Detroit, MI, USA, 2020, pp. 3139-3144, doi: 10.1109/ECCE44975.2020.9235410, such an inverter arm is subject to a crosstalk phenomenon between the high side and low side switches, a phenomenon which is more particularly marked with wide-gap components.

If we look at what happens at a high side switch transistor and a low side switch transistor of an inverter arm: during the low side transistor initiation period, the gate-drain capacitance of the high side transistor is charged, the high voltage variation dV/dt causes a current to flow through the gate loop resulting in a positive overvoltage on the gate-source voltage. Once the threshold voltage of the low side transistor is exceeded, this transistor changes state (it switches), and depending on the sign of this threshold, the semiconductor component will either be "initiated" or "turned off". If the gate-source voltage reached due to the overvoltage is higher than the threshold voltage of the high side transistor, it may activate it and lead to a short circuit of the inverter arm, the two high side and low side switches being then initiated at the same time. During the deactivation period of the low side transistor, the gate-drain capacitance of the high side component is discharged and the current flowing through the gate loop produces a negative voltage on the gate. The negative voltage may be lower than the minimum allowable gate-source voltage which repeatedly damages and prematurely ages the component.

Figure 1:
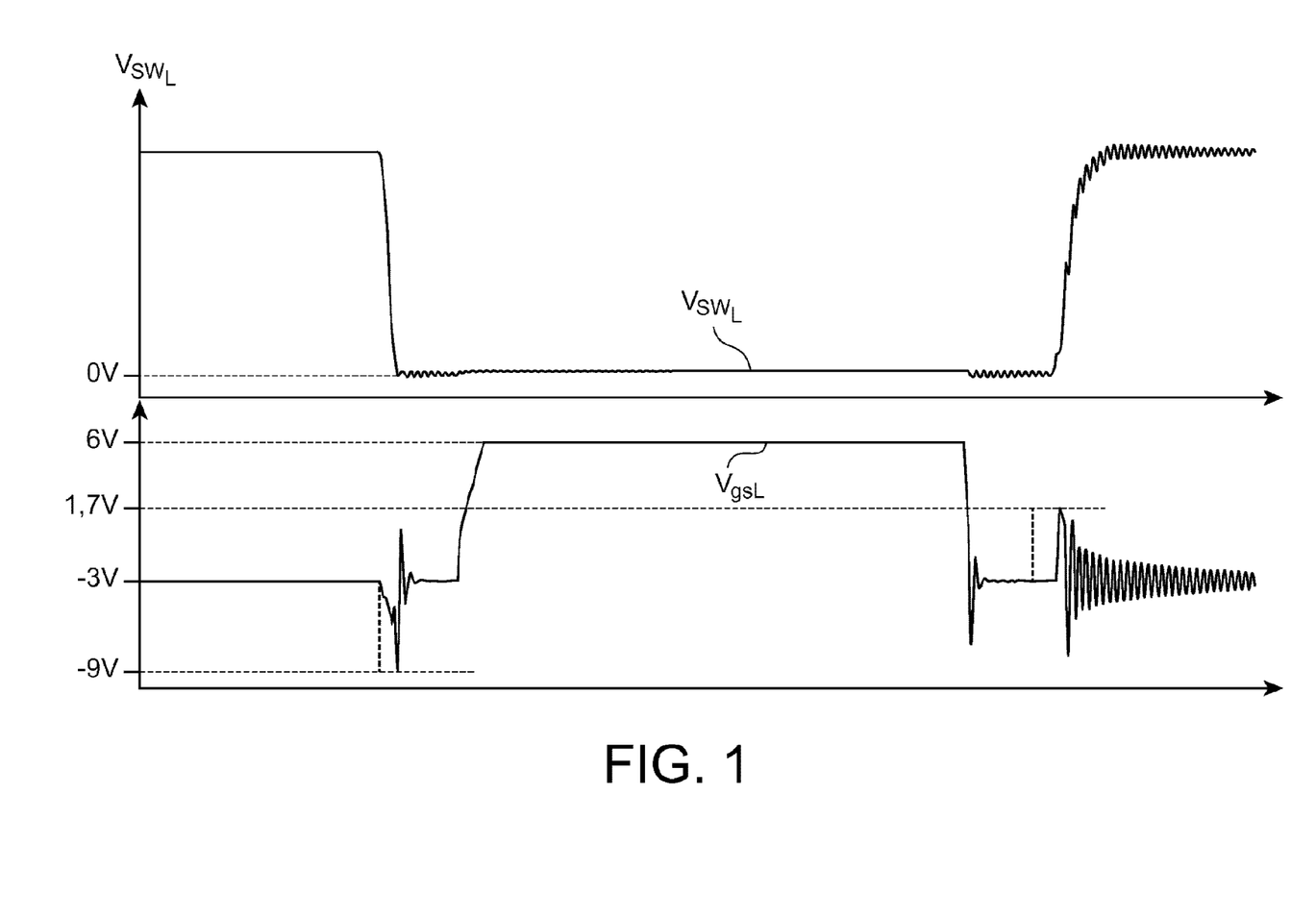
FIG. 1 already discussed above provides an example of transient overvoltages likely to appear due to crosstalk between the high side and low side switches of an inverter arm of the prior art.

An example of these transient phenomena is shown in FIG. 1. The upper curve represents the low side transistor drain-source voltage $V_{SwL}$ while the lower curve represents the low side transistor gate-source voltage $V_{gsL}$. There is a negative overvoltage on the low side transistor gate-source voltage $V_{gsL}$ when the high side switch is deactivated and a positive overvoltage on the low side transistor gate-source voltage $V_{gsL}$ when the high side switch is activated. The negative overvoltage is for example capable of causing a gate-source voltage of −9V where the minimum authorised voltage is of the order of −10V for components with a wide GaN gap for example. This minimum voltage can be exceeded when several components are arranged in parallel. Repetition of such negative stress damages and prematurely ages the transistors. The positive overvoltage is itself, for example, likely to cause a gate-source voltage of 1.7 V where the threshold voltage of a GaN-based component is comprised between 1.2 and 1.5 V, hence a risk of short-circuiting the arm of the inverter by the transition of the high side transistor to the on state.

It will be noted that these transient phenomena and their deleterious effects are exacerbated when the switches are formed of several transistors in parallel.

Known solutions to these transient phenomena are as follows.

A first solution, proposed for example in N. Idir, R. Bausiere, and J. J. Franchaud, "Active gate voltage control of turn-on di/dt and turn-off dv/dt in insulated gate transistors", IEEE Transactions on Power Electronics, vol. 21, no 4, p. 849-855, July 2006, doi: 10.1109/TPEL.2007.876895, is to increase the value of the gate resistor placed between the output of the transistor control circuit and the gate of the transistor. This solution allows to reduce the switching speed expressed in dV/dt and therefore the undesirable overvoltages on the gate-source voltage of the transistor. However, this solution leads to an increase in switching losses.

A second solution, proposed for example in Z. Zhang, F. Wang, L. M. Tolbert, B. J. Blalock, and D. J. Costinett, "Active gate driver for fast switching and cross-talk suppression of SiC devices in a phase-leg configuration", in 2015 IEEE Applied Power Electronics Conference and Exposition (APEC), 2015, p. 774-781, doi: 10.1109/APEC.2015.7104437, uses a control circuit which generates a third level of control voltage allowing to limit the positive overvoltage on the gate voltage of the transistor during the transient state. This solution is limited because it only addresses the problem of positive overvoltage and therefore only allows a partial resolution of the problem.

A third solution, proposed for example in E. Aeloiza, A. Kadavelugu, and R. Rodrigues, "Novel Bipolar Active Miller Clamp for Parallel SiC MOSFET Power Modules", in 2018 IEEE Energy Conversion Congress and Exposition (ECCE), 2018, p. 401-407, doi:10.1109/ECCE.2018.8558216, consists of the addition of an active Miller clamp circuit composed of a transistor, a resistor and a capacitor on each transistor of the switch, allowing to reduce the level of the gate-source voltage in the transient phases. This active Miller clamp circuit is in practice only required on one of the inverter arm switches. However, it is necessary to provide as many active clamp circuits as there are transistors in parallel forming the considered switch.

DESCRIPTION OF THE INVENTION

The purpose of the invention is to limit, or even eliminate, the effects of all the transient phenomena mentioned above without requiring a circuit dedicated to each transistor of a plurality of transistors arranged in parallel to form a switch.

It proposes for this purpose a circuit for controlling a first switch comprising at least one transistor, the first switch being arranged in series with a second switch in an inverter arm of an electrical power supply device intended to supply a load connected to the mid-point of the series arrangement of the first and second switch. The control circuit is configured to adjust the gate-source voltage of the at least one transistor of the first switch according to a control scheme comprising, successively and during a deactivation period of the first switch, the reduction of said gate-source voltage in a time window including the activation of the second switch and the increase of said gate-source voltage in a time window including the deactivation of the second switch.

Some preferred but non-limiting aspects of this circuit are:

it comprises three first selectively controllable transistors for applying one of three gate voltages to the gate of the at least one transistor and three second selectively controllable transistors for applying one of three source voltages to the source of the at least one transistor;

the three source voltages comprise a negative voltage, a neutral voltage and a first transient state voltage and the three gate voltages comprise a positive voltage, the neutral voltage and a second transient state voltage;

it comprises a drive unit configured to control the three first transistors and the three second transistors so that:

in an activation period of the first switch, the positive voltage is applied to the gate of the at least one transistor and the neutral voltage is applied to the source of the at least one transistor;

in the deactivation period of the first switch, outside the time window including the deactivation of the second switch and the time window including the activation of the second switch, the neutral voltage is applied to the gate of the at least one transistor and the negative voltage is applied to the source of the at least one transistor;

in the time window including the deactivation of the second switch, the second transient state voltage is applied to the gate of the at least one transistor and the neutral voltage is applied to the source of the at least one transistor;

in the time window including the activation of the second switch, the second transient state voltage is applied to the gate of the at least one transistor and the first transient state voltage is applied to the source of the at least one transistor;

it comprises a power supply unit configured to deliver the positive voltage and the negative voltage and, connected to the power supply unit, a voltage regulator configured to deliver the first transient state voltage and the second transient state voltage;

the voltage regulator can be driven to modify one and/or the other of the first transient state voltage and the second transient state voltage;

it is further configured to adjust the gate-source voltage of the at least one transistor of the second switch according to a control scheme comprising, during a deactivation period of the second switch, the increase of said gate-source voltage in a time window including the deactivation of the first switch and the reduction of said gate-source voltage in a time window including the activation of the first switch.

BRIEF DESCRIPTION OF THE DRAWINGS

Other aspects, purposes, advantages and features of the invention will appear better upon reading the following detailed description of preferred embodiments thereof, given by way of non-limiting example, and made with reference to the appended drawings on which.

DETAILED DESCRIPTION OF PARTICULAR EMBODIMENTS

Figure 2:
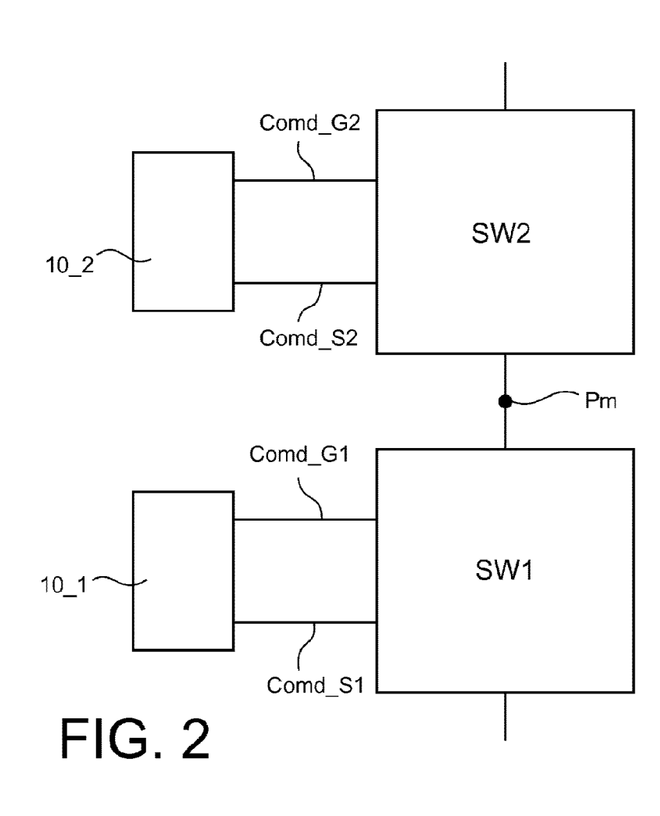
FIG. 2 is a diagram of an inverter arm equipped with control circuits according to the invention.

FIG. 2 shows an inverter arm of an electrical power supply device intended to supply a load connected to the mid-point Pm of a series arrangement of a first SW1 and second switch SW2. In FIG. 2, the first switch SW1 forms the low side switch of the inverter arm and the second switch SW2 forms the high side switch of the inverter arm.

Each of these switches SW1, SW2 is driven by a control circuit 10_1, 10_2 of gate driver type. Each of these circuits 10_1, 10_2 allows to amplify and adapt the gate-source voltage level of the transistor(s) making up the corresponding switch SW1, SW2 to control the opening and closing of the switch at a given frequency, by means of a gate voltage control Comd_G1, Comd_G2 and a source voltage control Comd_S1, Comd_S2. Together, these circuits 10_1, 10_2 form a control circuit for the high and low switches of the inverter arm.

The first and second switches SW1 and SW2 are for example SiC or GaN-based wide-gap semiconductor transistor switches. For high power applications, transistors in parallel are used in order to obtain the desired power.

Figure 3:
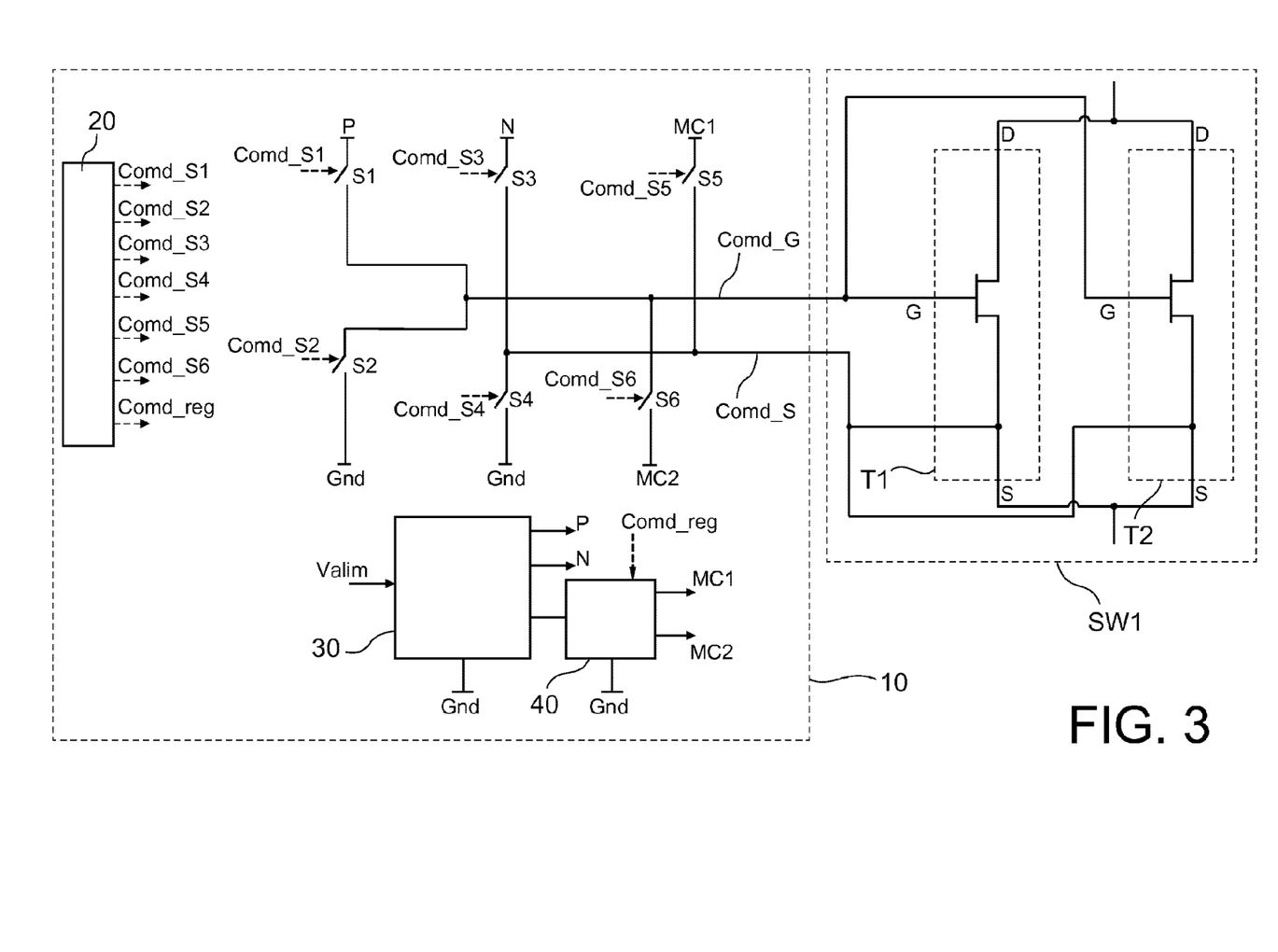
FIG. 3 is a diagram of a control circuit according to the invention.

With reference to FIG. 3, the invention relates to a control circuit 10 for a first switch, for example the switch SW1. This first switch comprises at least one transistor which includes a drain D, a source S and a gate G. The example of a first switch composed of several transistors in parallel, for example two transistors T1, T2 arranged in parallel, whose drains, sources and gates are respectively at the same potential, will be taken in what follows. Similarly, the second switch comprises at least one transistor, for example several transistors in parallel.

According to the invention, the control circuit 10 is not only in charge of controlling the opening and closing of the first switch SW1 at a given frequency but is also configured to reduce the transient stresses on the gates of the transistors of the first switch SW1, thereby improving the reliability of the electrical power supply device. The control circuit 10 is more particularly configured to allow adjustment of the gate-source voltage of the transistors of the first switch in a timely manner by means of a gate voltage control Comd_G and a source voltage control Comd_S.

As the phenomenon of crosstalk appears on the gate-source voltage of the two switches SW1 and SW2, a similar adjustment is implemented to regulate the transistor gate-source voltage in the second switch SW2 in order to reduce the transient stresses therein. This regulation is carried out in accordance with a control scheme substantially in phase opposition to that regulating the transistor gate-source voltage in the first switch. This regulation, carried out according to the same principles, can be implemented by a dedicated control circuit identical to the circuit 10 or, preferably, by the same circuit 10 thus responsible for regulating both the first and the second switch.

More specifically, the control circuit 10 is configured to adjust the gate-source voltage of the transistors of the first switch according to a control scheme comprising, during a deactivation period of the first switch, the increase of said gate-source voltage in a time window including the deactivation of the second switch and the reduction of said gate-source voltage in a time window including the activation of the second switch.

Similarly, the control circuit 10 can be configured to adjust the gate-source voltage of the transistor(s) of the second switch according to a control scheme comprising, during a deactivation period of the second switch, the increase of said gate-source voltage in a time window including the deactivation of the first switch and the reduction of said gate-source voltage in a time window including the activation of the first switch.

The following description takes the example of the adjustment of the transistor gate-source voltage in the first switch SW1, it being recalled that the adjustment of the transistor gate-source voltage in the second switch SW2 is carried out according to the same principles, preferably by the same circuit 10.

By increasing the transistor gate-source voltage in the first switch SW1 in the time window including the deactivation of the second switch SW2, the negative excursion of the gate-source voltage in the first switch due to the transient negative overvoltage appearing at the deactivation of the second switch is of lesser magnitude. The control circuit 10 therefore allows to prevent the gate-source voltage in the first switch from falling below the minimum authorised voltage. The risk of damaging the transistors of the first switch is thus reduced.

Moreover, by decreasing the gate-source voltage in the first switch in a time window including the activation of the second switch, the positive excursion of the gate-source voltage in the first switch due to the transient positive overvoltage appearing at the activation of the second switch is of lesser magnitude. The control circuit 10 therefore allows to prevent the gate-source voltage in the first switch from exceeding the threshold voltage. The risk of a short-circuit current appearing is therefore reduced.

The control circuit 10 may comprise three first transistors S1, S2 and S6 selectively controllable via respective controls Comd_S1, Connd_S2 and Connd_S6 to apply one of three gate voltages to the gate of the transistors of the first switch and three second transistors S3, S4 and S5 selectively controllable via respective controls Comd_S3, Comd_S4 and Comd_S5 to apply one of three source voltages to the source of the transistors of the first switch.

Transistors S1-S6 are low current transistors called low current signal transistors. They are referenced to different voltage potentials. Thus the three source voltages comprise a negative voltage N to which the transistor S3 is referenced, a neutral voltage Gnd to which the transistor S4 is referenced and a first transient state voltage MC1 to which the transistor S5 is referenced. The three gate voltages in turn comprise a positive voltage P to which the transistor S1 is referenced, the neutral voltage Gnd to which the transistor S2 is referenced and a second transient state voltage MC2 to which the transistor S6 is referenced.

The control circuit 10 further comprises a drive unit 20 configured to control the three first transistors S1, S2 and S6 and the three second transistors S3, S4 and S5 by delivering to them the respective controls Comd_S1, Comd_S2 and Comd_S6 on the one hand and Comd_S3, Comd_S4 and Comd_S5 on the other hand.

Figure 4:
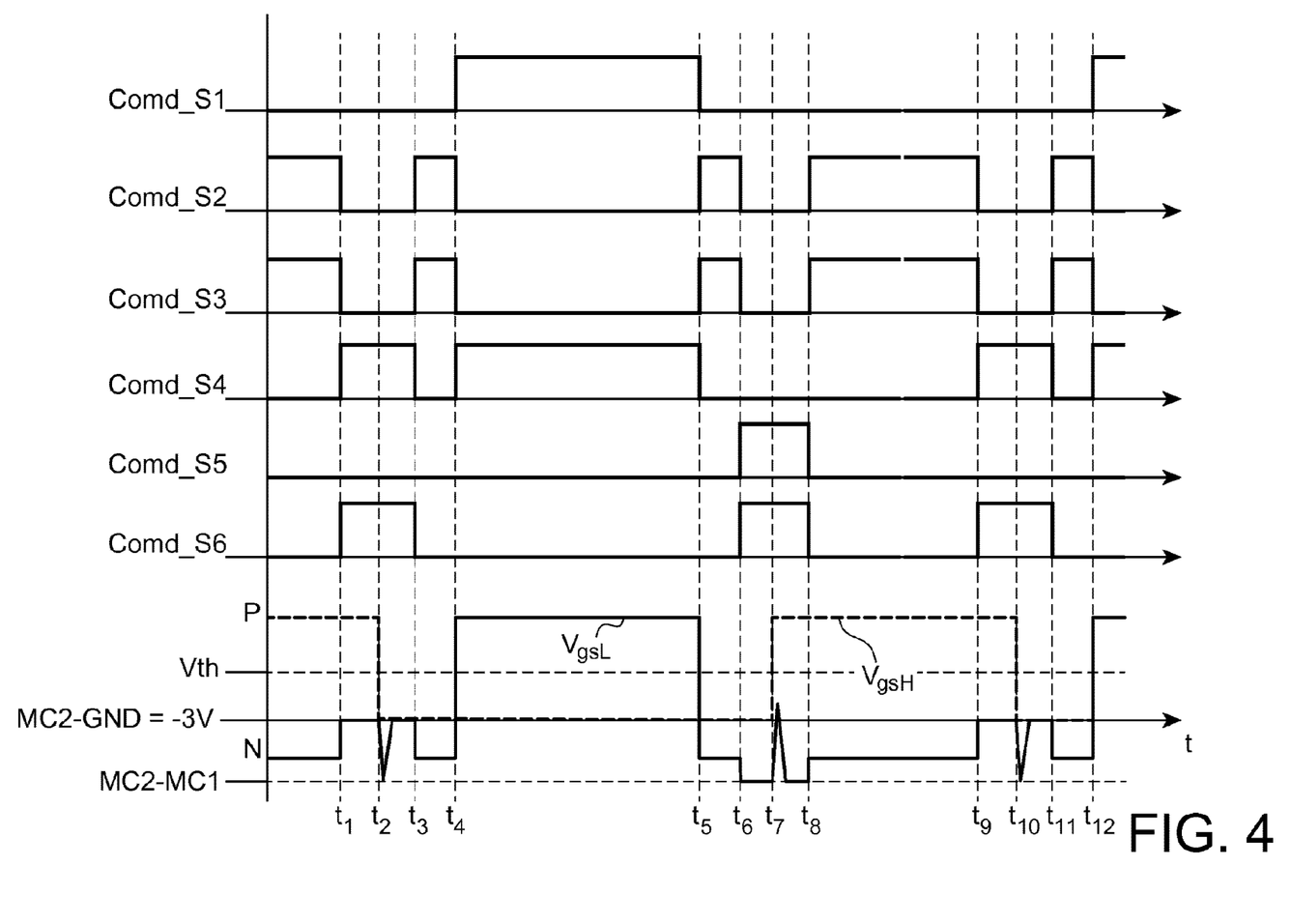
FIG. 4 shows examples of timing diagrams of the control of the various transistors of the control circuit of FIG. 2.

FIG. 4 shows timing diagrams of these various controls in accordance with the invention that allow to control the gate-source voltage $V_{gSL}$ of the transistors of the first switch (in solid lines) and the gate-source voltage $V_{gsH}$ of the transistors of the second switch (in dotted lines) according to the activation/deactivation sequence of the first and second switches of the inverter arm. It emerges that the drive unit 20 controls the transistors S1-S6 of the control circuit 10 of FIG. 3 as follows.

During the activation period of the first switch SW1, the positive voltage P is applied to the gate of the transistors of the first switch and the neutral voltage Gnd is applied to the source of the transistors of the first switch. The transistors S1 and S4 are therefore turned on, the others being turned off, between $t_4$ and $t_5$.

In the deactivation period of the first switch SW1, outside the time window including the deactivation of the second switch SW2 and the time window including the activation of the second switch, the neutral voltage Gnd is applied to the gate of the transistors of the first switch and the negative voltage N is applied to the source of the transistors of the first switch. The transistors S2 and S3 are therefore turned on, the others being turned oft before $t_1$, between $t_3$ and $t_4$, between $t_5$ and $t_6$ and after $t_8$.

In the time window including the deactivation of the second switch, the second transient state voltage MC2 is applied to the gate of the transistors of the first switch and the neutral voltage Gnd is applied to the source of the first switch. The transistors S4 and S6 are therefore turned on, the others being turned oft between $t_1$ and $t_3$. The gate-source voltage of the transistors of the first switch is thus raised between $t_1$ and $t_3$, allowing to limit the negative excursion of this voltage when the negative overvoltage caused by the deactivation at the time $t_2$ of the second switch occurs. The voltage MC2 is therefore chosen to be greater than the negative voltage N and preferably such that, the gate-source voltage in the first switch being brought to MC2-Gnd, the transient negative overvoltage does not drive this gate-source voltage below the minimum allowed voltage. In practice, the value of the second transient state voltage MC2 can correspond to that of the neutral voltage Gnd, this choice being advantageous because the level Gnd is already available and it is therefore not necessary to generate a reference voltage level specific for transistor S6.

In the time window including the activation of the second switch, the second transient state voltage MC2 is applied to the gate of the transistors of the first switch and the first transient state voltage MC1 is applied to the source of the transistors of the first switch. The transistors S5 and S6 are therefore controlled in the on state, the others in the off state, between $t_6$ and $t_8$. The gate-source voltage in the first switch is thus lowered between $t_6$ and ta, limiting the positive excursion of this voltage when the positive overvoltage caused by the activation of the second switch at time $t_7$ occurs. In practice, the voltages MC1 and MC2 are chosen such that the difference MC2-MC1 is less than the negative voltage N and preferably such that when the gate-source voltage in the first switch is brought to MC2-MC1, the transient positive overvoltage does not drive this gate-source voltage above the threshold voltage $V_{th}$, threshold voltage which depends on the technology of the transistors used to produce the switch. In one example, the second transient state voltage MC2 advantageously corresponds to the neutral voltage Gnd and the amplitude of the first transient state voltage MC1 is greater than that of the negative voltage N. The voltage MC1 is limited by the negative voltage applicable on the gate of the transistor which depends on the transistor technology.

It can thus be seen in FIG. 4 that the gate-source voltage of the transistor of the first switch SW1 is applied according to a control scheme comprising, successively and during a deactivation period [t5-t12] of the first switch, the reduction of said gate-source voltage in a time window [t6-t8] including the activation [at t7] of the second switch and the increase of said gate-source voltage in a time window [t9-t11] including the deactivation [at t10] of the second switch.

As shown in FIG. 3, the control circuit 10 may further comprise a power supply unit 30 which typically provides an isolated electrical power supply of the control circuit. The power supply unit is power supplied by a power supply voltage Valim and is configured to deliver the positive voltage P and the negative voltage N. The control circuit may further comprise a voltage regulator 40 connected to the power supply unit 30 and configured to deliver the first transient state voltage MC1 and the second transient state voltage MC2 from the power supply voltage Valim. The first transient state voltage MC1 and the second transient state voltage MC2 can be adjusted or modified by driving the voltage regulator 40 by a control signal Comd_reg delivered by the drive unit 20.

The control circuit 10 according to the invention is particularly simple in design, requiring only a simple control of six signal transistors referenced to different voltage potentials from the isolated power supply unit II is further inexpensive in terms of the number of additional components to be integrated, the same circuit simultaneously controlling all the transistors in parallel of the concerned switch.

Figure 5:
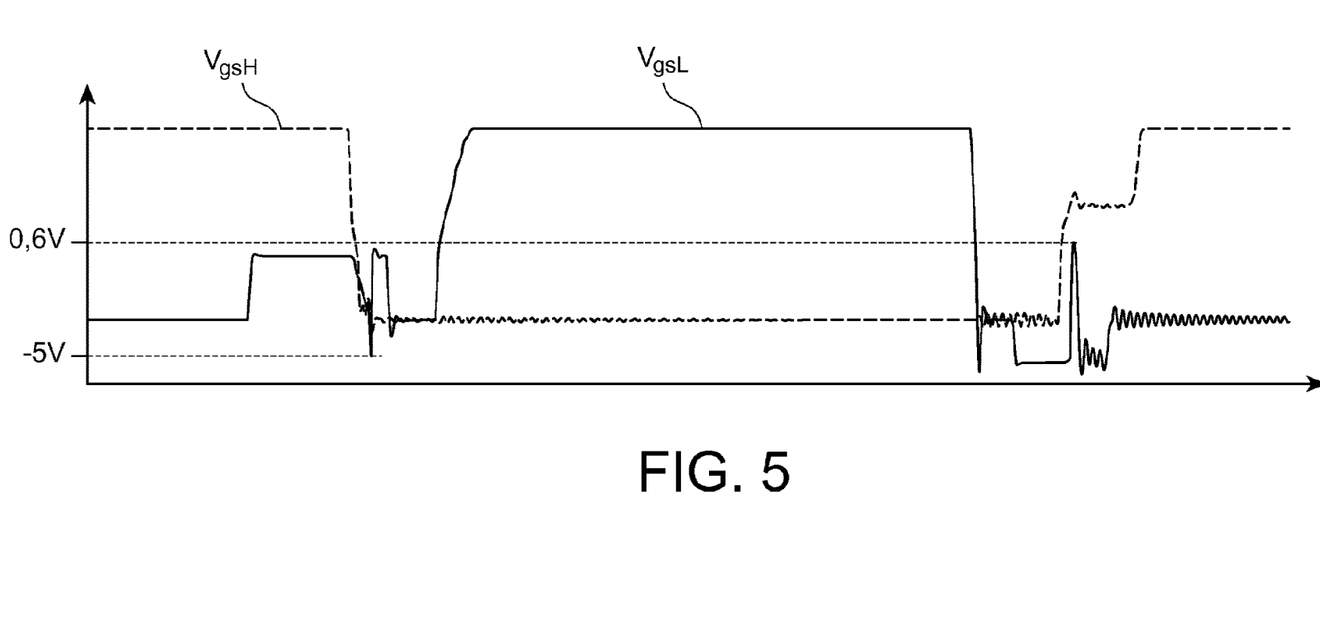
FIG. 5 provides an example of transient overvoltages likely to appear due to crosstalk between the high side and low side switches of an inverter arm provided with a control circuit according to the invention.

It was also possible to verify the effectiveness of a control circuit 10 according to the invention, as illustrated in FIG. 5, for limiting the transient overvoltages likely to appear due to crosstalk between the high side (gate-source voltage $V_{gSH}$) and low side (gate-source voltage $V_{gsL}$) switches of an inverter arm with 2 GaN transistors in parallel per switch. In this example, the positive voltage P is 6V, the negative voltage N is −3V, the first transient state voltage MC1 is 5V, the second transient state voltage MC2 and the neutral voltage are 0V. By comparison with FIG. 1, it can be seen that the negative peak voltage has gone from −9V to −5V, which limits the stress on the control gate. It can also be seen that the positive peak voltage is reduced to 0.6 V whereas it was 1.7 V, that is to say greater than the threshold voltage, in FIG. 1, which limits the crosstalk.

The invention is not limited to the control circuit described above but also extends to the control method implemented by this circuit as well as to a computer program comprising instructions for the implementation of this method. The invention also extends to a power supply device intended to supply a load connected to the mid-point of a series arrangement of a first switch and a second switch in an inverter arm, said device comprising the control circuit previously described. In this electrical power supply device, depending on the power level of the application, the first switch may comprise a transistor or else a plurality of transistors in parallel, the gate-source voltages of which are controlled by the control circuit described previously. The invention also extends to an aircraft equipped with such a power supply device.

The invention claimed is:

1. A circuit for controlling a first switch comprising at least one transistor, the first switch being arranged in series with a second switch in an inverter arm of an electrical power supply device intended to supply a load connected to the mid-point of the series arrangement of the first and second switch, wherein the control circuit is configured to adjust the gate-source voltage of the at least one transistor of the first switch according to a control scheme comprising, successively and during a deactivation period of the first switch, the reduction of said gate-source voltage in a time window including the activation of the second switch and the increase of said gate-source voltage in a time window including the deactivation of the second switch.

2. The control circuit according to claim 1, comprising three first selectively controllable transistors for applying one of three gate voltages to the gate of the at least one transistor and three second selectively controllable transistors for applying one of three source voltages to the source of the at least one transistor.

3. The control circuit according to claim 2, wherein the three source voltages comprise a negative voltage, a neutral voltage and a first transient state voltage and wherein the three gate voltages comprise a positive voltage, the neutral voltage and a second transient state voltage.

4. The control circuit according to claim 3, further comprising a drive unit configured to control the three first transistors and the three second transistors so that:
   in an activation period of the first switch, the positive voltage is applied to the gate of the at least one transistor and the neutral voltage is applied to the source of the at least one transistor;
   in the deactivation period of the first switch, outside the time window including the deactivation of the second switch and the time window including the activation of the second switch, the neutral voltage is applied to the gate of the at least one transistor and the negative voltage is applied to the source of the at least one transistor;
   in the time window including the deactivation of the second switch, the second transient state voltage is applied to the gate of the at least one transistor and the neutral voltage is applied to the source of the at least one transistor;
   in the time window including the activation of the second switch, the second transient state voltage is applied to the gate of the at least one transistor and the first transient state voltage is applied to the source of the at least one transistor.

5. The control circuit according to claim 3, comprising a power supply unit configured to deliver the positive voltage and the negative voltage and, connected to the power supply unit, a voltage regulator configured to deliver the first transient state voltage and the second transient state voltage.

6. The control circuit according to claim 5, wherein the voltage regulator can be driven to modify one and/or the other of the first transient state voltage and the second transient state voltage.

7. The control circuit according to claim 1, wherein the control circuit is further configured to adjust the gate-source voltage of the at least one transistor of the second switch according to a control scheme comprising, during a deactivation period of the second switch, the increase of said gate-source voltage in a time window including the deactivation of the first switch and the reduction of said gate-source voltage in a time window including the activation of the first switch.

8. An electrical power supply device intended to supply a load connected to the mid-point of a series arrangement of a first switch and a second switch in an inverter arm, comprising a control circuit of the first switch according to claim 1.

9. The electrical power supply device according to claim 8, wherein the first switch comprises a plurality of transistors in parallel.

10. The electrical power supply device according to claim 8, wherein the first and second switches are based on wide-gap transistors, of the SiC or GaN type.

11. An aircraft comprising a load and an electrical power supply device according to claim 8 for supplying the load.

12. A method for controlling a first switch comprising at least one transistor, the first switch being arranged in series with a second switch in an inverter arm of an electrical power supply device intended to supply a load connected to the mid-point of the series arrangement of the first and second switch, comprising an adjustment of the gate-source voltage of the at least one transistor of the first switch according to a control scheme comprising, successively and during a deactivation period of the first switch, the reduction of said gate-source voltage in a time window including the activation of the second switch and the increase of said gate-source voltage in a time window including the deactivation of the second switch.

13. A non-transitory computer readable medium storing a computer program comprising instructions which, when the program is executed by a computer, implements the method according to claim 12.

* * * * *